US010733922B2

(12) United States Patent
Park et al.

(10) Patent No.: US 10,733,922 B2
(45) Date of Patent: Aug. 4, 2020

(54) DISPLAY DEVICE HAVING CRACK DETECTING LINE

(71) Applicant: Samsung Display Co., Ltd., Yongin-si, Gyeonggi-do (KR)

(72) Inventors: Jong Won Park, Asan-si (KR); Hyun Woong Kim, Gwangmyeong-si (KR)

(73) Assignee: Samsung Display Co., Ltd. (KR)

( * ) Notice: Subject to any disclaimer, the term of this patent is extended or adjusted under 35 U.S.C. 154(b) by 97 days.

(21) Appl. No.: 15/995,582

(22) Filed: Jun. 1, 2018

(65) Prior Publication Data

US 2018/0350284 A1 Dec. 6, 2018

(30) Foreign Application Priority Data

Jun. 1, 2017 (KR) ........................ 10-2017-0068586

(51) Int. Cl.

*H01L 23/58* (2006.01)
*G09G 3/00* (2006.01)
*G09G 3/20* (2006.01)

(52) U.S. Cl.

CPC ............... *G09G 3/006* (2013.01); *G09G 3/20* (2013.01); *G09G 2310/0272* (2013.01); *G09G 2330/12* (2013.01)

(58) Field of Classification Search

CPC ...................................................... G09G 3/006
USPC ............................................................ 257/48
See application file for complete search history.

(56) References Cited

U.S. PATENT DOCUMENTS

| | | | | |
|---|---|---|---|---|
| 9,747,825 B2 * | 8/2017 | Kim | G02F 1/1309 | |
| 2013/0009663 A1 * | 1/2013 | Gauch | H01L 22/34 | 324/762.01 |
| 2013/0321730 A1 * | 12/2013 | Huang | G09G 3/006 | 349/41 |
| 2014/0176844 A1 * | 6/2014 | Yanagisawa | G02F 1/1309 | 349/43 |
| 2016/0189581 A1 * | 6/2016 | Hwang | G09G 3/006 | 345/691 |
| 2016/0225312 A1 * | 8/2016 | Byun | G09G 3/3208 | |
| 2016/0260367 A1 * | 9/2016 | Kwak | G09G 3/006 | |
| 2016/0267826 A1 * | 9/2016 | Seo | G09G 3/006 | |
| 2016/0293078 A1 * | 10/2016 | Byun | G09G 3/006 | |
| 2016/0322451 A1 * | 11/2016 | Park | H01L 27/3276 | |

(Continued)

FOREIGN PATENT DOCUMENTS

| | | |
|---|---|---|
| KR | 10-0750192 B1 | 8/2007 |
| KR | 10-2016-0097437 A | 8/2016 |

(Continued)

*Primary Examiner* — Caleb E Henry
(74) *Attorney, Agent, or Firm* — Innovation Counsel LLP

(57) ABSTRACT

A display device includes: a substrate; pixels provided in a display area of the substrate; signal lines provided on the substrate and connected to the pixels; and a pad portion provided in a peripheral area and including pads. The signal lines include a first crack detecting line provided in the peripheral area and connected to a first test voltage pad, first data lines including first ends connected to the first crack detecting line through corresponding first transistors and second ends connected to corresponding pixels from among the pixels, and first connecting wires for connecting the first data lines and pads corresponding to the first data lines from among the pads, and the first connecting wires are provided on one layer from among at least two layers.

15 Claims, 15 Drawing Sheets

(56) References Cited

U.S. PATENT DOCUMENTS

| | | | | |
|---|---|---|---|---|
| 2016/0372017 | A1* | 12/2016 | Byun | G09G 3/006 |
| 2017/0256504 | A1* | 9/2017 | Minami | G01R 31/2644 |
| 2017/0263880 | A1* | 9/2017 | Lee | H01L 51/52 |
| 2018/0033354 | A1* | 2/2018 | Lee | G09G 3/006 |
| 2018/0053466 | A1* | 2/2018 | Zhang | H01L 51/0031 |
| 2018/0053792 | A1* | 2/2018 | Shin | H01L 27/1218 |
| 2018/0158741 | A1* | 6/2018 | Kim | H01L 22/12 |
| 2018/0158894 | A1* | 6/2018 | Park | H01L 51/0031 |
| 2018/0166525 | A1* | 6/2018 | Kim | H01L 51/0031 |
| 2018/0174505 | A1* | 6/2018 | Mandlik | G09G 3/3266 |
| 2018/0350284 | A1* | 12/2018 | Park | G09G 3/006 |
| 2019/0019441 | A1* | 1/2019 | Shin | H01L 51/0031 |
| 2019/0157607 | A1* | 5/2019 | Kim | H01L 51/5237 |

FOREIGN PATENT DOCUMENTS

| | | | |
|---|---|---|---|
| KR | 100-2016-0139122 | A | 12/2016 |
| KR | 10-2017-0000884 | A | 1/2017 |

* cited by examiner

DISPLAY DEVICE HAVING CRACK DETECTING LINE

CROSS-REFERENCE TO RELATED APPLICATION

This application claims priority to and the benefit of Korean Patent Application No. 10-2017-0068586 filed in the Korean Intellectual Property Office on Jun. 1, 2017, the entire contents of which are incorporated herein by reference.

BACKGROUND a Field

The present disclosure relates to a display device.

b Description of the Related Art

As a display device has become down-sized, light in weight, and thinner, an increase of durability of the display device with respect to cracks, scratches, or breaking phenomena that may be generated by external impacts is required.

The display device includes a display panel including pixels for displaying an image. When the display panel is cracked, foreign matter such as moisture may permeate into a display area of the display panel. The permeation of foreign matter through cracks causes a defect of the display panel. Therefore, it is becoming increasingly important to accurately detect whether the display panel is cracked.

A pad portion for inputting and outputting signals used for controlling an operation of the display panel is formed on the display panel in addition to the pixels, and connecting wires connected to the pad portion and transmitting signals are formed thereon.

As the pixels are disposed at high density, the connecting wires connected to the pad portion and transmitting signals are precisely formed, so adjacent connecting wires are shorted to each other or the connecting wires may be opened because of various processing reasons to cause defects. Therefore, it is important to accurately detect the defects of the wires formed on the display panel.

The above information disclosed in this Background section is only for enhancement of understanding of the background and therefore it may contain information that does not form the prior art that is already known in this country to a person of ordinary skill in the art.

SUMMARY

Exemplary embodiments provide a display device for easily detecting a defect of a display device caused by cracks.

Exemplary embodiments provide a display device for detecting a defect generated on a connecting wire of a display panel.

Exemplary embodiments provide a display device for forming a circuit for detecting cracks and signal line defects in a narrow area on a substrate of a display panel.

An exemplary embodiment provides a display device including: a substrate including a display area and a peripheral area provided near the display area; a plurality of pixels provided in the display area of the substrate; a plurality of signal lines provided on the substrate and connected to the plurality of pixels; and a pad portion provided in the peripheral area and including a plurality of pads. The plurality of signal lines include a first crack detecting line provided in the peripheral area and connected to a first test voltage pad, a plurality of first data lines including first ends connected to the first crack detecting line through corresponding first transistors and second ends connected to corresponding pixels from among the plurality of pixels, and a plurality of first connecting wires for connecting the plurality of first data lines and pads corresponding to the plurality of first data lines from among the plurality of pads, and the plurality of first connecting wires are provided on one layer from among at least two layers.

The plurality of signal lines may further include a first test voltage line including a first end connected to the first test voltage pad, and a second end connected to second data lines connected to corresponding pixels from among the plurality of pixels through second transistors.

The first test voltage line may include a resistor with resistance corresponding to wire resistance of the first crack detecting line.

The resistance of the first test voltage line may be proportional to the wire resistance and a number of the first data lines, and may be inversely proportional to a number of the second data lines.

The plurality of signal lines may further include: a second crack detecting line provided in the peripheral area and connected to a second test voltage pad; a plurality of third data lines including first ends connected to the second crack detecting line through corresponding third transistors, and second ends connected to corresponding pixels from among the plurality of pixels; a plurality of second connecting wires for connecting the plurality of third data lines and pads corresponding to the plurality of third data lines from among the plurality of pads; and a second test voltage line including a first end connected to the second test voltage pad, and a second end connected to fourth data lines connected to corresponding pixels from among the plurality of pixels through fourth transistors, and the plurality of second connecting wires are provided on one corresponding layer from among the at least two layers.

Two adjacent second data lines from among the second data lines and two adjacent fourth data lines from among the fourth data lines may be alternately arranged.

The plurality of signal lines may further include a plurality of third connecting wires for connecting the second data lines and pads corresponding to the second data lines from among the plurality of pads, and a plurality of fourth connecting wires for connecting the fourth data lines and pads corresponding to the fourth data lines from among the plurality of pads, and the plurality of third connecting wires and the plurality of fourth connecting wires are provided on one corresponding layer from among the at least two layers.

Third connecting wires connected to two adjacent second data lines from among the third connecting wires are provided on different layers.

A first voltage corresponding to a black gray may be configured to be applied to the first test voltage pad and the second test voltage pad in a first detecting mode, and the first voltage may be configured to be applied to the first test voltage pad and a voltage corresponding to a white gray may be configured to be applied to the second test voltage pad in a second detecting mode.

The plurality of signal lines may further include a control line connected to gates of the first transistors, gates of the second transistors, gates of the third transistors, and gates of the fourth transistors.

The first transistors, the second transistors, the third transistors, and the fourth transistors may be provided in a region among the pads, the first data lines, the second data lines, the third data lines, and the fourth data lines.

The first crack detecting line may be a wire circulating along an edge of the display area.

The first crack detecting line may be a wire alternately traveling back and forth along one side of the display area.

Another embodiment provides a display device including: a substrate including a display area and a peripheral area provided near the display area; a plurality of pixels provided in the display area of the substrate; and a plurality of signal lines provided on the substrate and connected to the plurality of pixels, wherein the plurality of signal lines include a plurality of data lines connected to the plurality of pixels, a first crack detecting line connected to first data lines from among the plurality of data lines through first transistors, provided in the peripheral area, and configured to receive a black gray voltage, a second crack detecting line connected to second data lines from among the plurality of data lines through second transistors, provided in the peripheral area, and configured to receive a white gray voltage, and a control line connected to gates of the first transistors and gates of the second transistors.

The display device may further include a plurality of data pads provided in the peripheral area, connected to the plurality of data lines, and configured to transmit a data voltage applied to the plurality of pixels, wherein the first transistors and the second transistors are provided in a region between the plurality of data pads and the plurality of data lines.

The plurality of signal lines may further include a first test voltage line and a second test voltage line connected to third data lines and fourth data lines excluding the first data lines and the second data lines from among the plurality of data lines through third transistors and fourth transistors.

The first test voltage line may include a resistor with resistance corresponding to wire resistance of the first crack detecting line, and the second test voltage line may include a resistor with resistance corresponding to wire resistance of the second crack detecting line.

The plurality of signal lines may further include a plurality of connecting wires for connecting the plurality of data pads and the plurality of data lines.

Connecting wires connected to adjacent data lines from among the plurality of connecting wires are provided on different layers.

The first crack detecting line and the second crack detecting line may be wires circulating along a corresponding edge of the display area.

The display device according to the exemplary embodiments may easily detect the crack and connecting wire defect of the display panel.

The display device according to the exemplary embodiments may provide a relatively wide display area on the display panel.

DETAILED DESCRIPTION OF THE EMBODIMENTS

Figure 1:
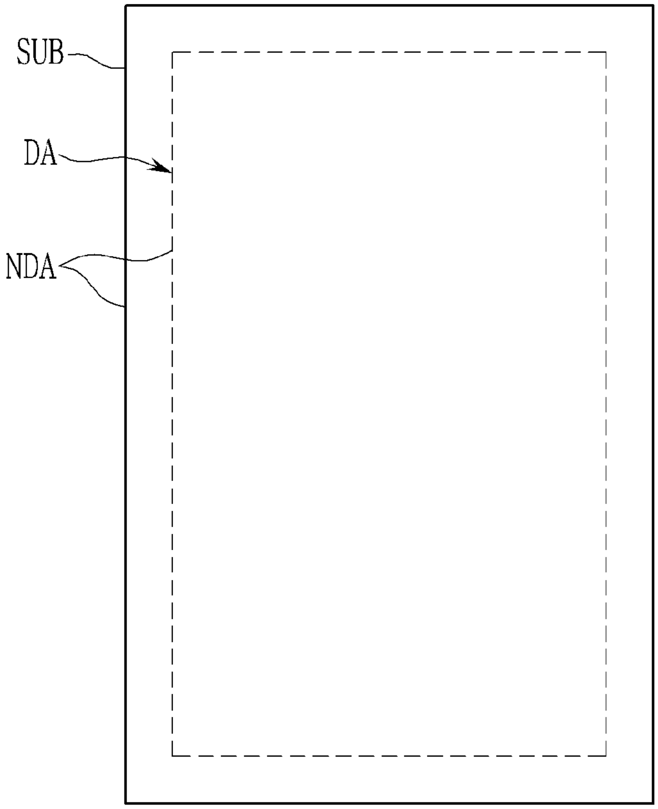
FIG. 1 shows a top plan view of a display device according to an exemplary embodiment.

The inventive concept will be described more fully hereinafter with reference to the accompanying drawings, in which exemplary embodiments are shown. As those skilled in the art would realize, the described embodiments may be modified in various different ways, all without departing from the spirit or scope of the inventive concept.

The drawings and description are to be regarded as illustrative in nature and not restrictive, and like reference numerals designate like elements throughout the specification.

The size and thickness of each component shown in the drawings are arbitrarily shown for better understanding and ease of description, but the embodiments are not limited thereto. In the drawings, the thickness of layers, films, panels, regions, etc., are exaggerated for clarity. For better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

Figure 2:
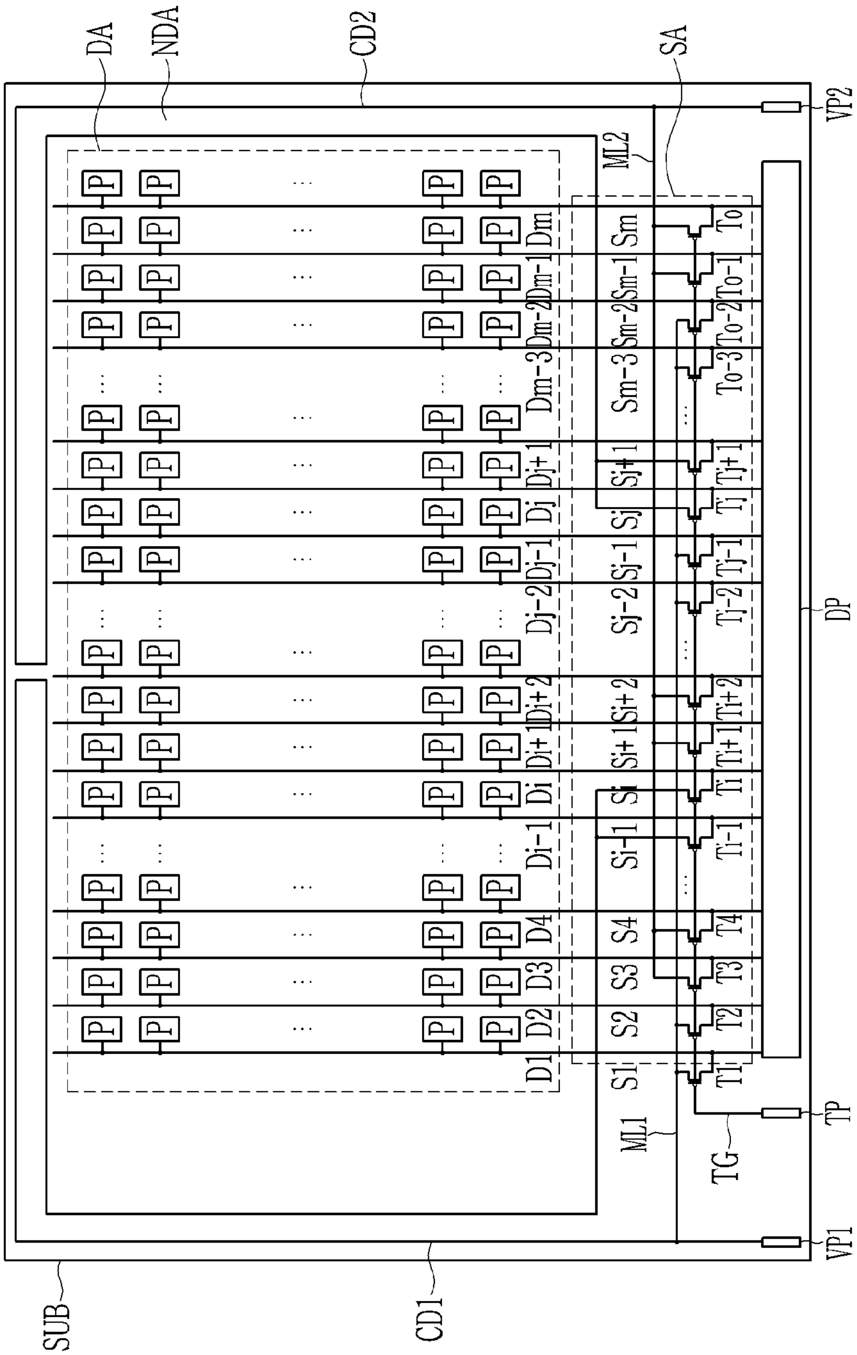
FIG. 2 shows a layout view of a display device according to an exemplary embodiment.

A display device according to an exemplary embodiment will now be described with reference to FIG. 1 and FIG. 2. FIG. 1 shows a top plan view of a display device according to an exemplary embodiment, and FIG. 2 shows a layout view of a display device according to an exemplary embodiment.

Referring to FIG. 1, the display device includes a substrate SUB, a display area DA for displaying an image, and a peripheral area NDA provided on an edge of the display area DA.

The substrate SUB is an insulating substrate including glass, a polymer, or stainless steel. The substrate SUB may be flexible, stretchable, foldable, bendable, or rollable. Hence, the display device may be flexible, stretchable, foldable, bendable, or rollable. For example, the substrate SUB may have a flexible film form including a resin such as a polyimide.

The peripheral area NDA is shown to enclose the display area DA in the illustrated exemplary embodiment, and the peripheral area NDA may be provided on either side or both sides of the display area DA.

As shown in FIG. 2, the display device includes a display panel including the substrate SUB. The display panel includes the display area DA for displaying an image, and the peripheral area NDA, provided near the display area DA, in which elements and/or signal lines for generating and/or transmitting various signals applied to the display area DA are disposed.

A data pad portion DP, test voltage pads VP1 and VP2, a test control pad TP, and test transistors T1-To are provided in the peripheral area NDA.

The data pad portion DP is connected to a plurality of data lines D1-Dm in the display area DA, and corresponding data signals are supplied to pixels P through the data pad portion DP. A printed circuit film not shown may be attached to the data pad portion DP, and bumps of the printed circuit film may be electrically connected to pads of the data pad portion DP.

The data lines D1-Dm may be connected to the data pad portion DP through connecting wires S1-Sm of a region SA. The connecting wires S1-Sm may be provided on a same layer or a different layer as/from the data lines D1-Dm. When the connecting wires S1-Sm and the data lines D1-Dm are provided on the different layers, the connecting wires S1-Sm may be connected to the data lines D1-Dm through a contact hole.

Further, the connecting wires S1-Sm may be provided on the different layers. For example, some connecting wires S1, S3, . . . , Si, Si+2, . . . , Sj−1, Sj+1, . . . , Sm−2, Sm of the connecting wires S1-Sm may be provided on a first layer, and other connecting wires S2, S4, . . . , Si−1, Si+1, . . . , Sj−2, Sj, . . . , Sm−3, Sm−1 of the connecting wires S1-Sm may be provided on a second layer that is different from the first layer. In this case, the adjacent connecting wires provided on the same layer may generate a short circuit defect.

Figure 3:
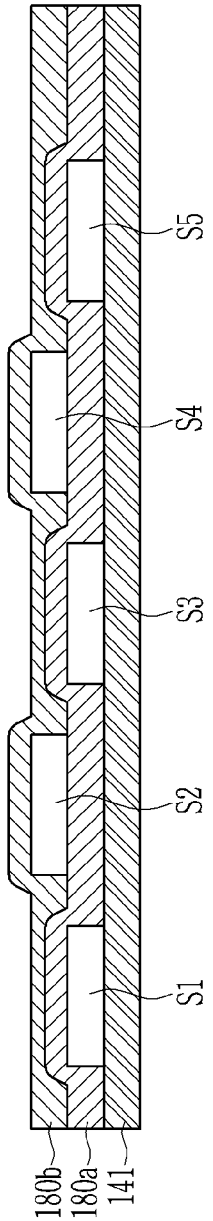
FIGS. 3, 4, and 5 show cross-sectional views of positions of connecting wires of a display device according to an exemplary embodiment.
Figure 4:
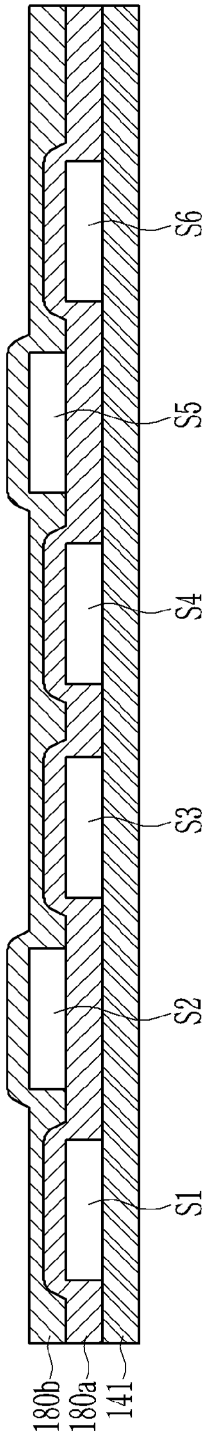
Figure 5:
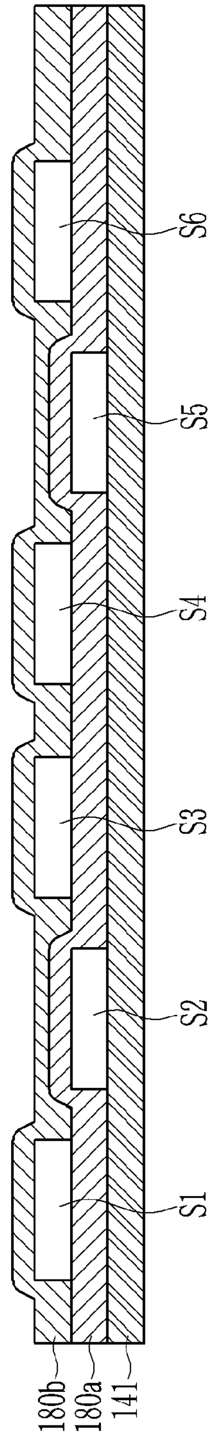

This will now be described with reference to FIG. 3 to FIG. 5. FIG. 3 to FIG. 5 show cross-sectional views of positions of connecting wires of a display device according to an exemplary embodiment.

As shown in FIG. 3, the adjacent connecting wires may be provided on the different layers. The connecting wires S1, S3, and S5 are provided on an insulating layer 141. An insulating layer 180*a* is provided on the connecting wires S1, S3, and S5 and the insulating layer 141. The connecting wires S2 and S4 are provided on the insulating layer 180*a*. An insulating layer 180*b* is provided on the insulating layer 180*a* and the connecting wires S2 and S4. The insulating layers 180*a* and 180*b* may include an organic material.

In another way, as shown in FIG. 4 and FIG. 5, the adjacent connecting wires may be provided on the different layers or the same layer. Referring to FIG. 4, the connecting wires S1, S3, S4, and S6 are provided on the insulating layer 141. The insulating layer 180*a* is provided on the connecting wires S1, S3, S4, and S6, and the insulating layer 141

The connecting wires S2 and S5 are provided on the insulating layer 180*a*. The insulating layer 180*b* is provided on the insulating layer 180*a* and the connecting wires S2 and S5. The insulating layers 180*a* and 180*b* may include an organic material.

Referring to FIG. 5, the connecting wires S2 and S5 are provided on the insulating layer 141. The insulating layer 180*a* is provided on the connecting wires S2 and S5 and the insulating layer 141. The connecting wires S1, S3, S4, and S6 are provided on the insulating layer 180*a*. The insulating layer 180*b* is provided on the insulating layer 180*a* and the connecting wires S1, S3, S4, and S6. The insulating layers 180*a* and 180*b* may include an organic material.

Although not shown in FIG. 3 to FIG. 5, a buffer layer may be further provided below the insulating layer 141, and at least one insulating layer including an organic material may be further provided over the insulating layer 180*b*.

Referring to FIG. 2, the test voltage pad VP1 accesses first ends of the test transistors T1, T2, . . . , Tj−2, Tj−1, . . . , To−3, To−2. The test voltage pad VP2 accesses first ends of the test transistors T3, T4, . . . , Ti+1, Ti+2, . . . , To−1, To. Same test voltages or different test voltages may be supplied to the test voltage pads VP1 and VP2 according to the detecting mode.

The test control pad TP is connected to gates of the test transistors T1-To. A test control signal is supplied to the test control pad TP.

The test transistors T1-To are connected between the data lines D1-Dm and the test voltage pads VP1 and VP2 in the peripheral area NDA.

A corresponding crack detecting line CD1 may be connected between first ends of some test transistors e.g., Ti−1 or Ti of the test transistors T1-To and the test voltage pad VP1. In a like manner, a corresponding crack detecting line CD2 may be connected between first ends of some test transistors e.g., Tj or Tj+1 of the test transistors T1-To and the corresponding test voltage pad VP2.

A test voltage line ML1 may be connected between first ends of the test transistors T1, T2, . . . , Tj−2, Tj−1, . . . , To−3, To−2 not connected to the first crack detecting line CD1 and the test voltage pad VP1.

A test voltage line ML2 may be connected between first ends of the test transistors T3, T4, . . . , Ti+1, Ti+2, . . . , To−1, To not connected to the second crack detecting line CD2 and the test voltage pad VP2.

The first crack detecting line CD1 and the second crack detecting line CD2 may be wires enclosing an outside of a corresponding region of the display area DA.

For example, the first crack detecting line CD1 may be provided to an outside of a left region of the display area DA, and the second crack detecting line CD2 may be provided to an outside of a right region of the display area DA. Further, at least one of the first crack detecting line CD1 and the second crack detecting line CD2 may be provided to an outside of an upper region of the display area DA.

Figure 6:
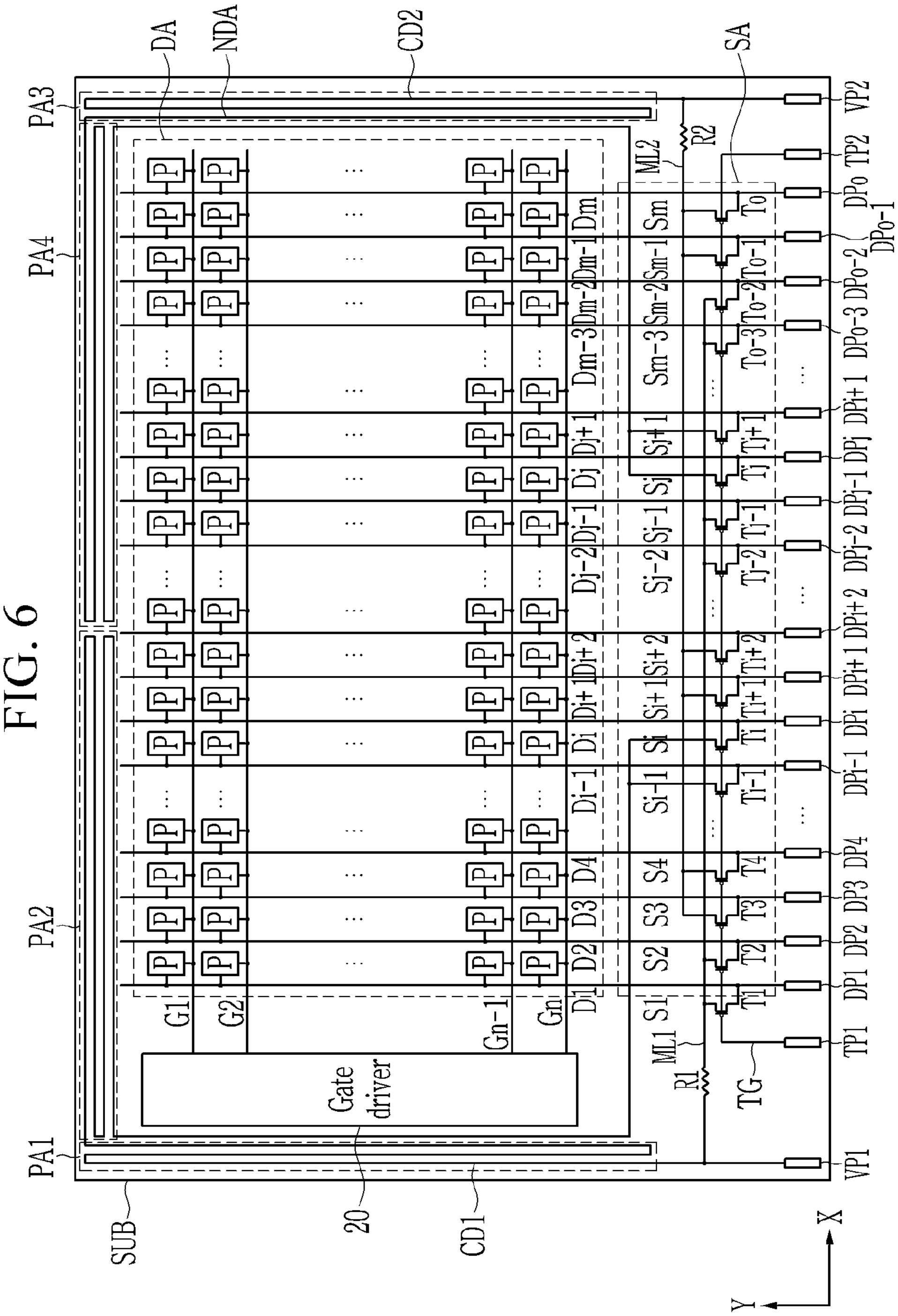
FIG. 6 shows a layout view of a display device according to an exemplary embodiment.

A configuration of a display device according to an exemplary embodiment will now be described with reference to FIG. 6. FIG. 6 shows a layout view of a display device according to an exemplary embodiment.

As shown, the display device includes a display panel. The display panel includes a display area DA in which a plurality of pixels P are provided, and a peripheral area NDA provided near the display area.

The pixels P are exemplarily disposed in a matrix formation in the display area DA of the display panel. Signal lines including gate lines G1-Gn and data lines D1-Dm are disposed in the display area DA. The gate lines G1-Gn may mainly extend in a row direction, and the data lines D1-Dm may mainly extend in a column direction crossing the row direction. Each pixel P may be connected to a corresponding gate line from among the gate lines G1-Gn and a corresponding data line from among the data lines D1-Dm to receive a gate signal and a data voltage from the signal lines.

A driving device for generating and/or processing various signals for driving the display panel is provided in the peripheral area NDA. The driving device includes a gate driver 20 for applying a gate signal to the gate lines G1-Gn, a data driver not shown for applying a data signal to the data lines D1-Dm, and a signal controller not shown for controlling the gate driver 20 and the data driver.

The gate driver 20 may be integrated with the display panel. The gate driver 20 may be provided on the right or the left of the display area DA. Differing from the shown exemplary embodiment, the gate driver 20 may respectively be provided to the right and the left of the display area DA, and may be electrically connected as a tape carrier package TCP to the display panel.

The data driver and the signal controller may be provided as a driving circuit chip. The driving circuit chip may be mounted as an integrated circuit chip on the display panel, or it may be electrically connected as a tape carrier package TCP to the display panel. The data driver and the signal controller may be formed to be a single chip or separate chips.

In addition, a first crack detecting line CD1, a second crack detecting line CD2, a first test voltage line ML1, and a second test voltage line ML2 may be provided in the peripheral area NDA. The peripheral area NDA in which the first crack detecting line CD1 and the second crack detecting line CD2 are provided may be bent.

In detail, data pads DP1-DPo, where o is a positive integer that is equal to or greater than m, test voltage pads VP1 and VP2, test control pads TP, and test transistors T1-To may be provided in the peripheral area NDA.

The data pads DP1-DPo are connected to the data lines D1-Dm through the connecting wires S1-Sm of the region SA. Although not shown, the display device may further include a source drive IC, and in this case, the data pads DP1-DPo are connected to the source drive IC. That is, the source drive IC supplies data voltages to the data pads DP1-DPo to supply the data voltage to the data lines D1-Dm of the display device.

The test control pads TP1 and TP2 are connected to the gates of the test transistors T1-To. A test control signal is supplied to the test control pads TP1 and TP2.

The test voltage pads VP1 and VP2 are connected to first ends of the test transistors. The test voltage pad VP1 may be connected to the test transistors T1, T2, . . . , Tj−2, Tj−1, . . . , To−3, To−2. The test voltage pad VP2 may be connected to the test transistors T3, T4, . . . , Ti+1, Ti+2, . . . , To−1, To.

Same test voltages or different test voltages may be supplied to the test voltage pads VP1 and VP2 according to the detecting mode.

For example, the same test voltage is supplied to the test voltage pads VP1 and VP2 in a first detecting mode, and different test voltages are supplied to the test voltage pads VP1 and VP2 in a second detecting mode. The first detecting mode represents a mode for detecting whether the connecting wires S1-Sm are opened and the first and second crack detecting lines CD1 and CD2 are cracked, and the second detecting mode represents a mode for detecting whether there is a short circuit among the connecting wires S1-Sm. The test transistors T1-To may be provided in the peripheral area NDA. The test transistors T1-To may be provided between the display area DA and the data pads DP1-DPo in the peripheral area NDA.

The test transistors T1-To are connected between the data lines D1-Dm and the test voltage pads VP1 and VP2. The gates TG of the test transistors T1-To are connected to the test control pads TP1 and TP2.

Each of first ends of the test transistors T1-To may be connected to one of the test voltage pads VP1 and VP2, and each of second ends may be connected to one of the connecting wires S1-Sm.

A corresponding crack detecting line CD1 may be provided between first ends of some test transistors Ti−1, Ti of the test transistors T1-To and the corresponding test voltage pad VP1. In a like manner, a corresponding crack detecting line CD2 may be provided between first ends of some test transistors Tj, Tj+1 of the test transistors T1-To and the corresponding test voltage pad VP2.

The first crack detecting line CD1 may be provided between first ends of the test transistors Ti−1, Ti connected to the data lines Di−1, Di and the test voltage pad VP1. The second crack detecting line CD2 may be provided between first ends of the test transistors Tj, Tj+1 connected to the data lines Dj, Dj+1 and the test voltage pad VP2.

The first crack detecting line CD1 and the second crack detecting line CD2 may be provided in the peripheral area NDA provided to the outside of the display area DA.

The first crack detecting line CD1 and the second crack detecting line CD2 may be provided further outside of the gate driver 20. The first crack detecting line CD1 may be provided to enclose an external side of the left region of the display area DA, and the second crack detecting line CD2 may be provided to enclose an external side of the right region of the display area DA.

The first crack detecting line CD1 may include a wire alternately traveling back and forth along one side of the display area DA. For example, the first crack detecting line CD1 may include a wire PA1 alternately traveling back and forth in a Y direction and a wire PA2 alternately traveling back and forth in an X direction.

The second crack detecting line CD2 may include a wire alternately traveling back and forth along one side of the display area DA. For example, the second crack detecting line CD2 may include a wire PA3 alternately traveling back and forth in the Y direction and a wire PA4 alternately traveling back and forth in the X direction.

Respective crack detecting lines may each be a wire provided on a single layer or wires provided on a plurality of layers and connected to each other through a contact hole, and they may be provided to circulate along a circumference of the display area DA, but they are not limited thereto.

Further, resistors R1 and R2 may be further provided in the peripheral area NDA of the substrate SUB. The resistors R1 and R2 may be formed by the first test voltage line ML1 or the second test voltage line ML2.

The resistor R1 may be formed to compensate for a voltage difference between a test voltage value applied to the data lines Di−1, Di and a test voltage value applied to the data lines D1, D2, . . . , Dj, Dj+1, . . . , Dm−3, Dm−2, which is generated by wire resistance of the first crack detecting line CD1.

The resistor R2 may be formed to compensate for a voltage difference between a test voltage value applied to the data lines Dj, Dj+1 and a test voltage value applied to the data lines D3, D4, . . . , Di+1, Di+2, . . . , Dm−1, Dm, which is generated by wire resistance of the second crack detecting line CD2.

That is, the resistor R1 may be connected to the first test voltage line ML1 for connecting first ends of the test transistors T1, T2, Tj−2, Tj−1, . . . , To−3, To−2 not connected to the first crack detecting line CD1 and the test voltage pad VP1. The resistor R2 may be connected to the second test voltage line ML2 for connecting first ends of the test transistors T3, T4, . . . , Ti+1, Ti+2, . . . , To−1, To not connected to the second crack detecting line CD2 and the test voltage pad VP2.

In this instance, a deviation of the test voltage caused by wire resistance of the crack detecting line CD1 may be minimized by designing resistance of the resistor R1 by use of wire resistance of the crack detecting line CD1. For example, resistance of the resistor R1 may be designed according to Equation 1.

$$R = \frac{R_{CD}}{k} \times T \times 1.25 \qquad \text{Equation 1}$$

Here, R is resistance of the resistor R1, $R_{CD}$ is wire resistance of the crack detecting line CD1, k is a number of data lines connected to the first test voltage line ML1, and T is a number of data lines connected to the crack detecting line CD1. In this instance, 1.25 is a constant that may be changeable to a positive integer that is greater than 0.

The resistor R1 may be designed by modifying a form of the first test voltage line ML1 in the region in which the first test voltage line ML1 is provided. For example, the resistor R1 satisfying the resistance calculated with Equation 1 may be formed by controlling a thickness, a length, or a width of the first test voltage line ML1.

The first test voltage line ML1 may be provided in a region between the region in which the test voltage pad VP1 is provided and the region in which the first end of the test transistor T1 is provided, so it is easy to provide a region for disposing the wire of the resistor R1.

The designing of resistance of the resistor R1 has been described, and resistance of the resistor R2 may be designed in a like manner.

It has been described in the shown exemplary embodiment that the data pads DP1-DPo, the test control pads TP1, TP2, the test voltage pads VP1 and VP2, the test transistors T1-To, and the resistors R1 and R2 are provided at a lower portion of the peripheral area NDA, and disposal of signal lines, pad portions, transistors, and resistors in the peripheral area NDA is not limited thereto.

Figure 7:
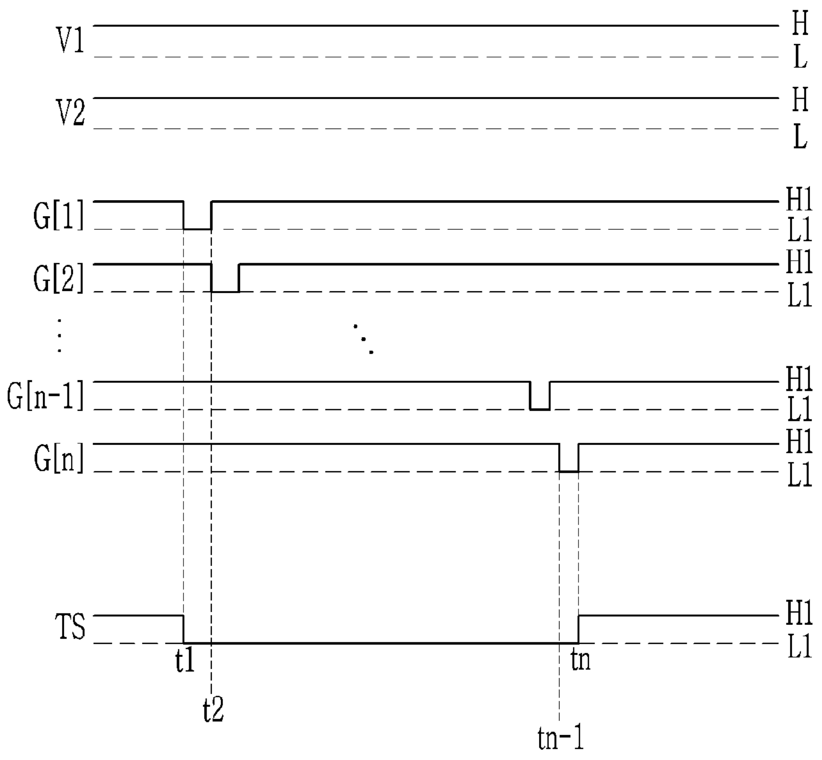
FIG. 7 shows a signal waveform diagram of a display device in a first detecting mode according to an exemplary embodiment.

FIG. 7 shows a signal waveform diagram of a display device in a first detecting mode according to an exemplary embodiment.

FIG. 7 shows voltages V1 and V2 applied to the test voltage pads VP1 and VP2, gate signals G[1]-G[n] applied to the gate lines G1-Gn, and a test control signal TS applied to the test control pads TP1 and TP2.

Referring to FIG. 7, the voltages V1 and V2 applied to the test voltage pads VP1 and VP2 are maintained at a high-level voltage H for a period t1-tn during which the test control signal TS has an enable level L1. The high-level voltage H will correspond to a black gray, hereinafter.

When the test control signal TS is at the enable level L1, the test transistors T1-To may be turned on. A voltage generated by the test voltages V1 and V2 may be supplied to the data lines D1-Dm through the turned-on test transistors T1-To.

The gate signals G[1]-G[n] may be sequentially changed into the enable level L1 for the period t1-tn in which the test control signal TS is at the enable level L1. For example, the gate signal G[1] is changed to the enable level L1 at the time t1 and is changed to the disable level H1 at the time t2, and the gate signal G[2] is changed to the enable level L1 at the time t2.

As the gate signals G[1]-G[n] are supplied to the pixel P, a voltage corresponding to the test voltages V1 and V2 may be programmed to the pixel P. The pixel P expresses a black gray by the voltage programmed to the pixel P.

Hereinafter, a testing method of a display device in a first detecting mode according to an exemplary embodiment will now be described with reference to FIG. 7, FIG. 8, and FIG. 9.

Figure 8:
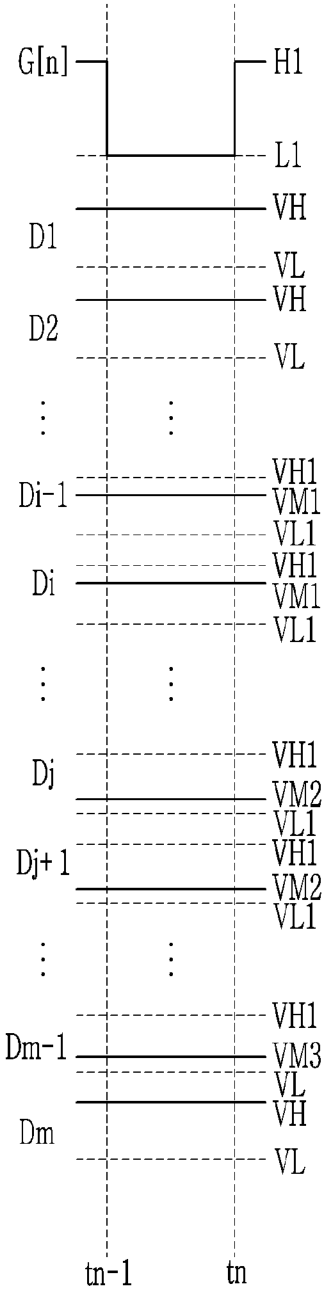
FIG. 8 shows a detailed waveform diagram of FIG. 7.
Figure 9:
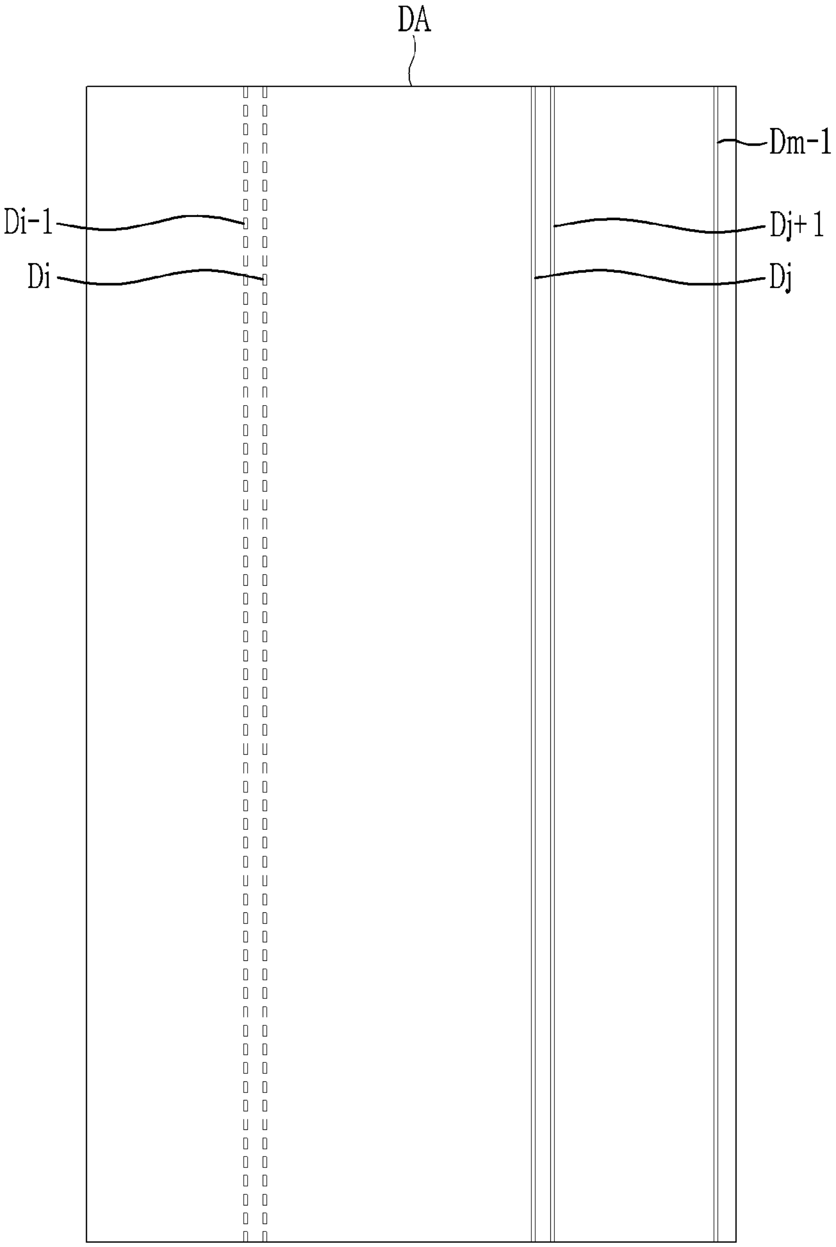
FIG. 9 shows a display area of a display device when a test signal is applied in a first detecting mode according to an exemplary embodiment.

FIG. 8 shows a detailed waveform diagram of FIG. 7, and FIG. 9 shows a display area of a display device when a test signal is applied in a first detecting mode according to an exemplary embodiment.

As shown in FIG. 8, when the gate signal G[n] is changed to the enable level within the period of the time tn−1 to the time tn, a voltage at a first high level VH may be applied to the data lines D1 and D2.

The high level voltage H may be lowered to be a voltage e.g., 6.5 V at a first high level VH by the resistor R1, and may be transmitted to the data lines D1 and D2. The pixels connected to the data line D1 and the data line D2 may express the black gray by the voltage at the first high level VH.

Further, the high level voltage H may fall to a voltage e.g., 6.7 V at a second high level VH1 by the crack detecting line CD1, and may be transmitted to the data lines Di−1, Di. The pixels connected to the data line Di−1 and the data line Di may express the black gray by the voltage at the second high level VH1.

In the first detecting mode, when the display device is cracked, the first and second crack detecting lines CD1 and CD2 may be disconnected, or wire resistance of the first and second crack detecting lines CD1 and CD2 may increase. Further, when at least one of the connecting wires S1-Sm is opened, wire resistance of the at least one opened connecting wire may increase.

For example, when the display device is cracked to disconnect the second crack detecting line CD2, the test voltage at the high level H is not transmitted to the data lines Dj, Dj+1 for the period of the time tn−1 to the time tn. The pixels connected to the data lines Dj, Dj+1 express a white gray to a bright gray by the voltage at a level VM2 that is lower than the voltage at the second high level VH1. That is, a strong bright line may be visible by the pixels connected to the data lines Dj, Dj+1.

For another example, when the display device is cracked to increase wire resistance of the first crack detecting line CD1, the voltage transmitted to the data lines Di−1, Di has a level VM1 that is lower than the voltage at the second high level VH1 by a voltage drop caused by the increase of wire resistance for the period from the time tn−1 to the time tn.

The pixels connected to the data lines Di−1, Di express the gray by the voltage at the level VM1 that is lower than the voltage at the second high level VH1. That is, a weak bright line may be visible by the pixels connected to the data lines Di−1, Di. In this instance, the increasing degree of wire resistance of the first crack detecting line CD1 may be less than the increasing degree of wire resistance caused by the disconnection of the second crack detecting line CD2, so the level VM1 may have a greater voltage than that of the level VM2. However, this is an example for description, and the exemplary embodiment is not limited thereto.

For another example, when at least one of the connecting wire Sm−1 is opened, the test voltage at the high level H is not transmitted to the data line Dm−1 for the period of the time tn−1 to the time tn. The pixel connected to the data line Dm−1 expresses the white gray to the bright gray by the voltage at a level VM3 that is lower than the voltage at the first high level VH. That is, a strong bright line may be visible by the pixels connected to the data line Dm−1.

The period of the time tn−1 to the time to during which the gate signal G[n] at an enable level L1 is supplied to the gate line Gn has been described, and the above-noted description may be equally applicable to the period of the time t1 to the time tn−1 during which gate signals G[1]-G[n−1] at the enable level L1 are supplied to the gate lines G1-Gn−1.

As shown in FIG. 9, the pixels connected to the data lines Di−1, Di receiving the test voltage by the first crack detecting line CD1 express the gray, so they may be visible as a weak bright line shown with dotted lines. It may therefore be determined that a minute crack is generated to the region in which the first crack detecting line CD1 is provided in the peripheral area NDA.

The pixels connected to the data lines Dj, Dj+1 receiving the test voltage by the second crack detecting line CD2 express the white gray, so they may be visible as a strong bright line shown with solid lines. It may therefore be determined that a substantial crack is generated to the region in which the second crack detecting line CD2 is provided in the peripheral area NDA.

The pixel connected to the data line Dm−1 receiving the test voltage by the connecting wire Sm−1 expresses the white gray, so it may be visible as a strong bright line shows with a solid line. It may therefore be determined that the connecting wire Sm−1 in the peripheral area NDA is opened.

As described above, according to an exemplary embodiment, it may be determined whether the display device may have a defect by using the characteristic that the voltages programmed to the corresponding pixels are different according to the disconnection or the change of wire resistance of the connecting wires S1-Sm or the disconnection or the change of wire resistance of the crack detecting lines CD1 and CD2 formed outside the display area DA in the first detecting mode.

Figure 10:
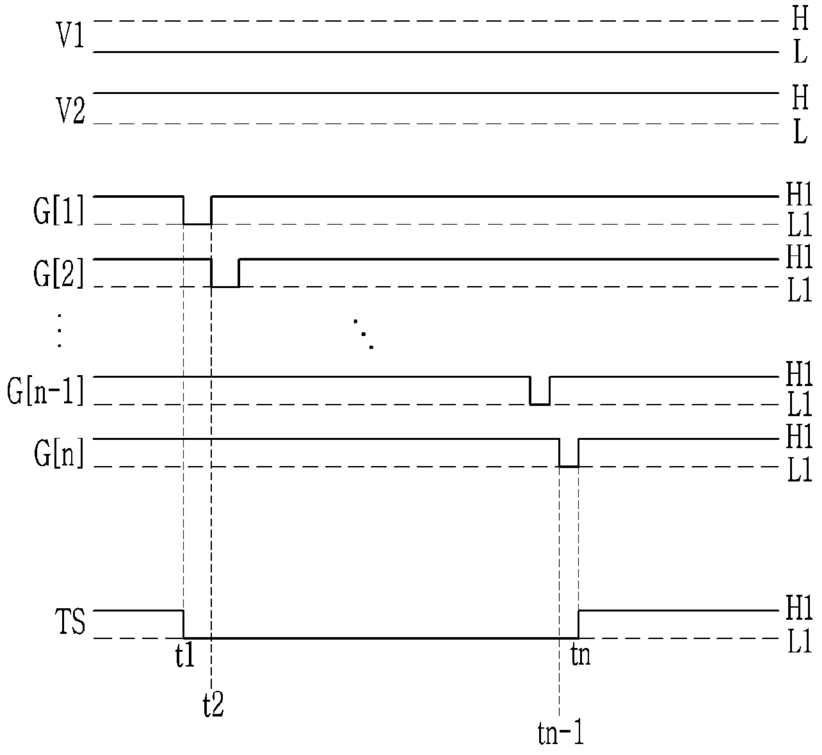
FIG. 10 shows a signal waveform diagram of a display device in a second detecting mode according to an exemplary embodiment.

FIG. 10 shows a signal waveform diagram of a display device in a second detecting mode according to an exemplary embodiment. FIG. 10 shows voltages V1 and V2 applied to the test voltage pads VP1 and VP2, gate signals G[1]-G[n] applied to the gate lines G1-Gn, and a test control signal TS applied to the test control pads TP1 and TP2.

Referring to FIG. 10, the voltage V1 applied to the test voltage pad VP1 is maintained at the voltage L at the low level and the voltage V2 applied to the test voltage pad VP2 is maintained at the voltage H at the high level for the period t1-tn during which the test control signal TS has an enable level L1. Hereinafter, the voltage L at the low level corresponds to the white gray.

When the test control signal TS is an enable level L1, the test transistors T1-To may be turned on. A voltage corresponding to the test voltages V1 and V2 may be supplied to the data lines D1-Dm through the turned-on test transistors T1-To.

The gate signals G[1]-G[n] may be sequentially changed to the enable level L1 for the period t1-tn during which the test control signal TS has an enable level L1. For example, the gate signal G[1] changes to the enable level L1 at the time t1, and it changes to the disable level H1 at the time t2. The gate signal G[2] then changed to the enable level L1 at the time t2.

As the gate signals G[1]-G[n] are supplied to the pixel P, the voltage VL generated by the test voltage V1 at the low level L is programmed to some of the pixels to thus express the white gray, and the voltage VH generated by the test voltage V2 at the high level H is programmed to some of the pixels to thus express the black gray.

In FIG. 6, the data lines D1-Dm are alternately connected to the test voltage pad VP1 or the test voltage pad VP2, so the entire display area DA may be visible as the gray that is in the middle of the white gray and the black gray.

Hereinafter, a method for testing a display device in a second detecting mode according to an exemplary embodiment will be described in detail with reference to FIG. 10, FIG. 11, and FIG. 12.

Figure 11:
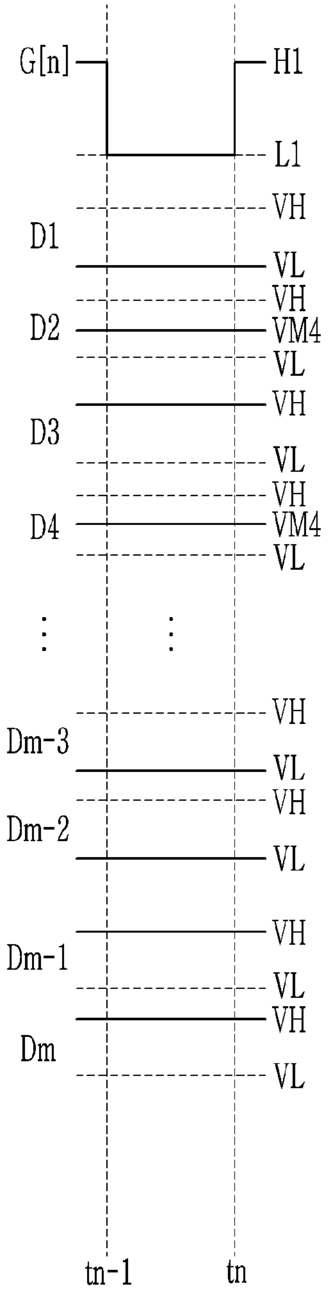
FIG. 11 shows a detailed waveform diagram of FIG. 10.
Figure 12:
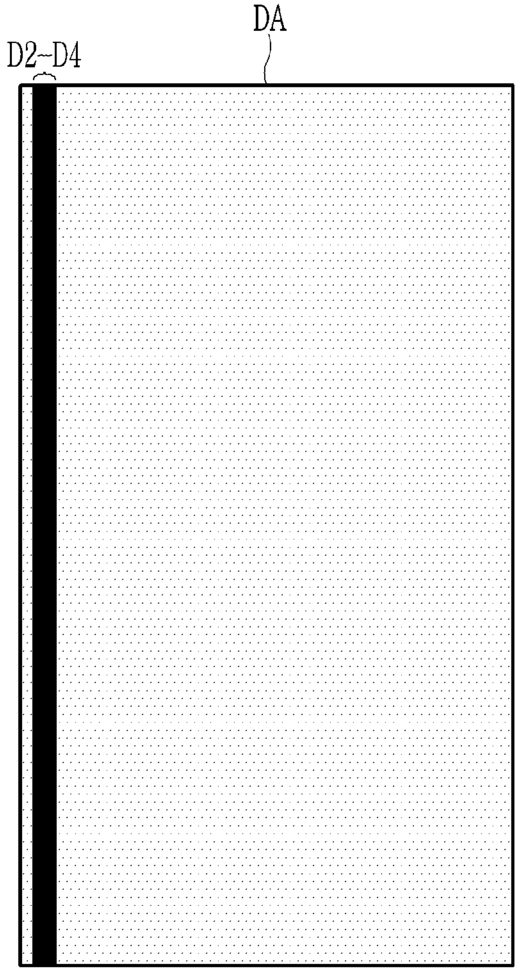
FIG. 12 shows a display area of a display device when a test signal is applied in a second detecting mode according to an exemplary embodiment.

FIG. 11 shows a detailed waveform diagram of FIG. 10 and FIG. 12 shows a display area of a display device when a test signal is applied in a second detecting mode according to an exemplary embodiment.

As shown in FIG. 11, when the gate signal G[n] is changed to the enable level within the period of the time tn−1 to the time in, a voltage generated by the voltage at the low level L may be applied to the data lines D1, D2, . . . , Di−1, Di, . . . , Dj−2, Dj−2, . . . , Dm−3, Dm−2 connected to the test voltage pad VP1.

For example, the voltage at the low level L may fall to the voltage at the first low level VL by the resistor R1, and may be transmitted to the data lines D1, D2, . . . , Dj−2, Dj−2, . . . , Dm−3, Dm−2. Further, the voltage at the low level L may fall by the crack detecting line CD1 and may be transmitted to the data lines Di−1, Di. The pixels connected to the data lines D1, D2, . . . , Di−1, Di, . . . , Dj−2, Dj−2, . . . , Dm−3, Dm−2 may express the white gray by the voltage at the low level L.

When the gate signal G[n] changes to the enable level within the period of the time tn−1 to the time tn, a voltage generated by the voltage at the high level H may be applied to the data lines D3, D4, . . . , Di+1, Di+2, . . . , Dj, Dj+1, . . . , Dm−1, Dm connected to the test voltage pad VP2.

For example, the voltage at the high level H may fall to the voltage at the first high level VH by the resistor R2, and may be transmitted to the data lines D3, D4, . . . , Di+1, Di+2, . . . , Dm−1, Dm. Further, the voltage at the high level H may fall by the second crack detecting line CD2 and may be transmitted to the data lines Dj, Dj+1. The pixels connected to the data lines D3, D4, . . . , Di+1, Di+2, . . . , Dj, Dj+1, . . . , Dm−1, Dm may express the black gray by the voltage at the high level H.

For the period of the time tn−1 to the time tn, the test voltage at the low level L is transmitted to the connecting wire S2 through the resistor R1, and the test voltage at the high level H is transmitted to the connecting wire S4 through the resistor R2.

When a short circuit is generated between the connecting wire S2 and the connecting wire S4 that are provided to be adjacent to each other on the same layer, the voltage VM4 between the voltages VH, VL transmitted to the two connecting wires S2 and S4 may be applied to the data lines D2 and D4. The pixels connected to the data lines D2 and D4 express the dark gray to the black gray by the voltage of the voltage VM4. The pixel connected to the data line D3 expresses the black gray by the voltage at the first high level VH.

That is, as shown in FIG. 12, the pixels connected to three consecutive data lines D2, D3, and D4 express the black gray or the dark gray, so the region that corresponds to the relating pixels may be visible as a dark line. It may therefore be determined that a short circuit is generated between the connecting wire S2 and the connecting wire S4.

As described above, an exemplary embodiment may determine whether the display device has a defect by using the fact that the voltage applied to the corresponding pixel changes by the short circuit of the connecting wires S1-Sm in the second detecting mode.

A configuration of a display device according to another exemplary embodiment will now be described with reference to FIG. 13.

Figure 13:
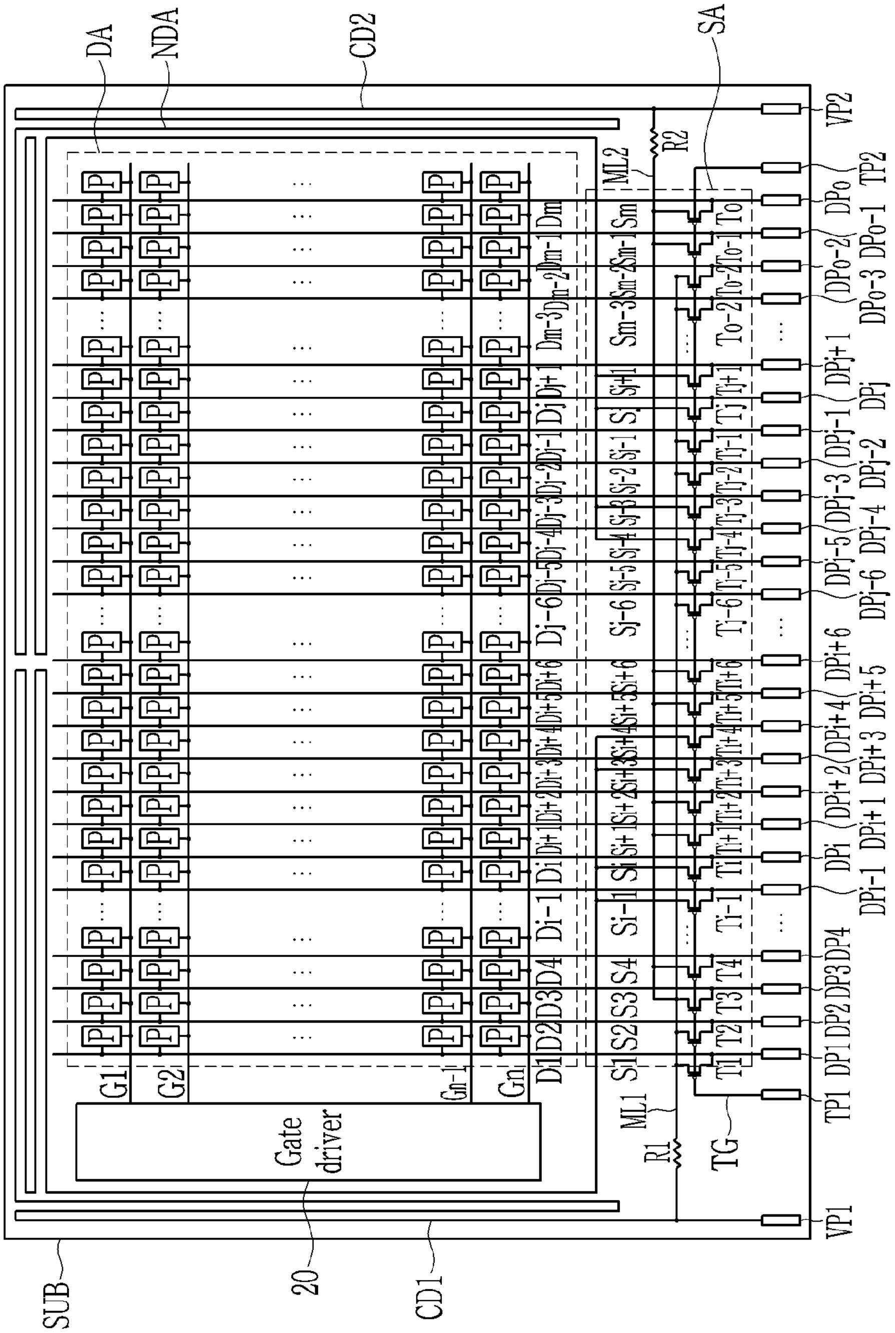
FIG. 13 shows a layout view of a display device according to another exemplary embodiment.

FIG. 13 shows a layout view of a display device according to another exemplary embodiment. A configuration of the display device except an access structure of the test transistors T1-To and the crack detecting lines CD1 and CD2, and the first test voltage line ML1 and the second test voltage line ML2 of FIG. 13, corresponds to the display device of FIG. 6 according to an exemplary embodiment, so no description thereof will be provided.

A crack detecting line CD1 may be provided between first ends of some test transistors Ti−1, Ti, Ti+3, Ti+4 of the test transistors T1-To and the corresponding test voltage pad VP1.

A crack detecting line CD2 may be provided between first ends of some test transistors Tj−4, Tj−3, Tj, Tj+1 of the test transistors T1-To and the corresponding test voltage pad VP2.

The first ends of the transistors Ti−1, Ti, Ti+3, Ti+4 may be connected to the first crack detecting line CD1, and the first ends of the test transistors Tj−4, Tj−3, Tj, Tj+1 may be connected to the second crack detecting line CD2.

That is, compared to an exemplary embodiment shown in FIG. 6, one crack detecting line may be connected to first ends of a plurality of corresponding test transistors.

In this case, as expressed in Equation 1, a value of T increases and a value of m decreases, so resistance of the resistor R1 or the resistor R2 may increase compared to an exemplary embodiment shown in FIG. 6. When resistance of the resistor R1 increases, the resistor R1 may be designed by changing a form thereof within the region in which the first test voltage line ML1 is provided. The first test voltage line ML1 may be provided in a region between a region in which the test voltage pad VP1 is provided and a region in which the first end of the test transistor T1 is provided, so it is easy to obtain the region for disposing the wire of the resistor R1.

The method for design resistance of the resistor R1 has been described, and resistance of the resistor R2 may be designed in a like manner.

The display device described with reference to FIG. 13 may be driven by the signals described with reference to FIG. 7 and FIG. 10. A method for detecting a defect of a display device will now be described with reference to FIG. 14 and FIG. 15.

Figure 14:
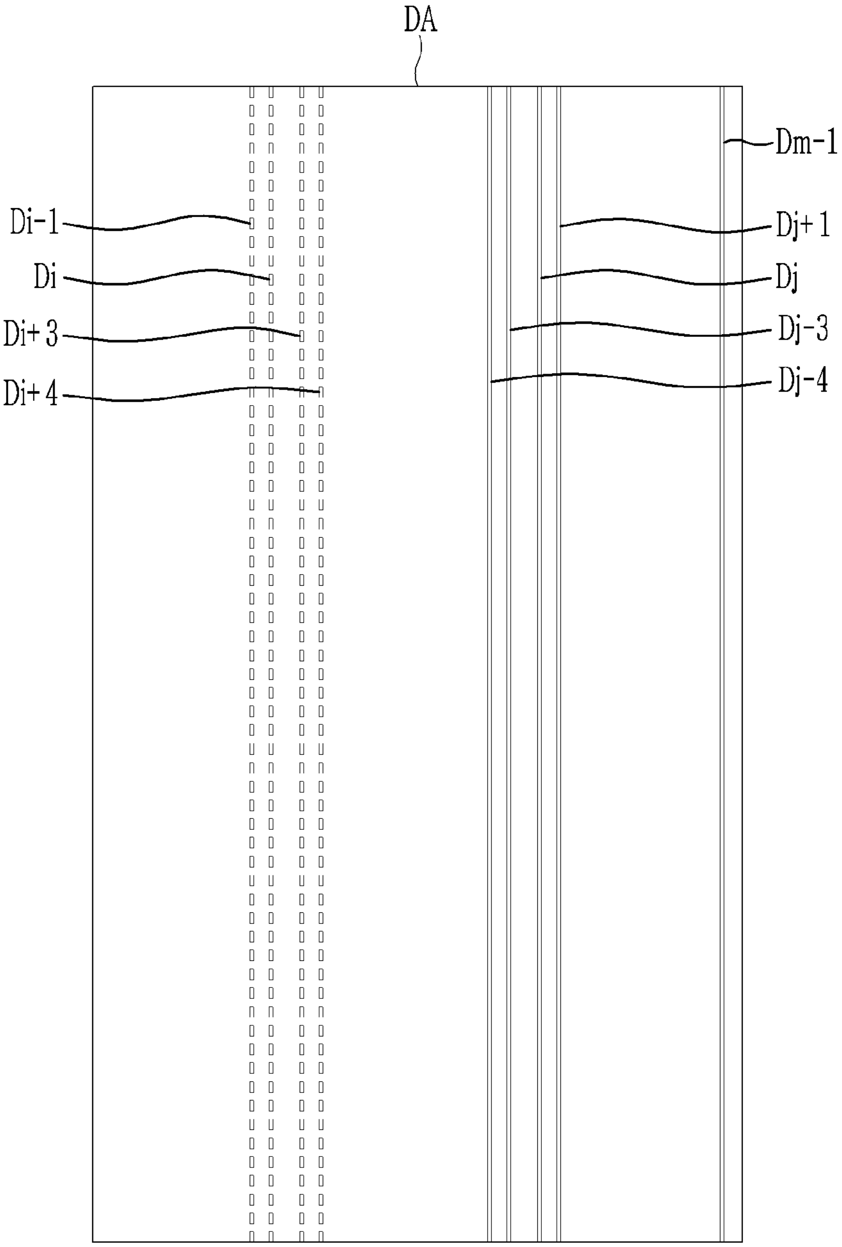
FIG. 14 shows a display area of a display device when a test signal is applied in a first detecting mode according to another exemplary embodiment.
Figure 15:
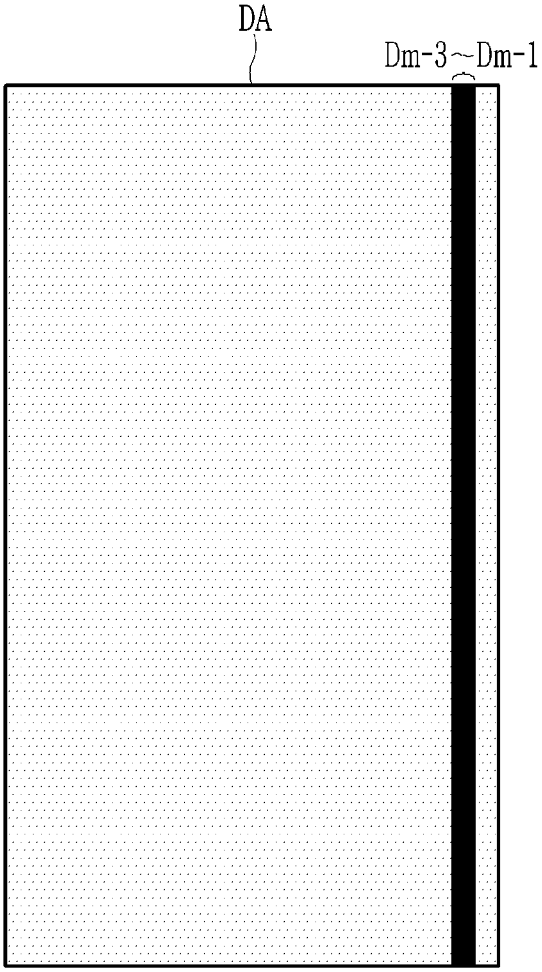
FIG. 15 shows a display area of a display device when a test signal is applied in a second detecting mode according to another exemplary embodiment.

FIG. 14 shows a display area of a display device when a test signal is applied in a first detecting mode according to another exemplary embodiment, and FIG. 15 shows a display area of a display device when a test signal is applied in a second detecting mode according to another exemplary embodiment.

The display device may be driven in the first detecting mode by the signals shown in FIG. 7. As shown in FIG. 14, the pixels connected to the data lines Di−1, Di, Di+3, Di+4 receiving the test voltage by the first crack detecting line CD1 express the light gray, so they may be visible as a weak bright line shown with dotted lines. It may therefore be determined that a minute crack is generated to the region in which the first crack detecting line CD1 is provided in the peripheral area NDA.

The pixels connected to the data lines Dj−4, Dj−3, Dj, Dj+1 receiving the test voltage by the second crack detecting line CD2 express the white gray, so they may be visible as a strong bright line shown with solid lines. It may therefore be determined that a substantial crack is generated to the region in which the second crack detecting line CD2 is provided in the peripheral area NDA.

The pixel connected to the data line Dm−1 receiving the test voltage by the connecting wire Sm−1 expresses the white gray, so it may be visible as a strong bright line shows with a solid line. It may therefore be determined that the connecting wire Sm−1 in the peripheral area NDA is opened.

As described above, according to another exemplary embodiment, it may be determined whether the display device may have a defect by using the characteristic that the voltages programmed to the corresponding pixels are different according to the disconnection or the change of wire resistance of the connecting wires S1-Sm or the disconnection or the change of wire resistance of the crack detecting lines CD1 and CD2 formed outside the display area DA in the first detecting mode.

The display device may be driven in the second detecting mode by the signals shown in FIG. 10. As shown in FIG. 15, the pixels connected to three consecutive data lines Dm−3, Dm−2, and Dm−1 express the black gray or the dark gray, so the region corresponding to the relating pixels may be visible as a dark line. It may therefore be determined that a short circuit is generated between the connecting wire Sm−3 and the connecting wire Sm−1.

As described above, an exemplary embodiment may determine whether the display device has a defect by using the fact that the voltage applied to the corresponding pixel changes by the short circuit of the connecting wires S1-Sm in the second detecting mode.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
a substrate including a display area and a peripheral area provided near the display area;
a plurality of pixels provided in the display area of the substrate;
a plurality of signal lines provided on the substrate and connected to the plurality of pixels; and
a pad portion provided in the peripheral area and including a plurality of pads,
wherein the plurality of signal lines include:
a first crack detecting line provided in the peripheral area and connected to a first test voltage pad,
a plurality of first data lines including first ends connected to the first crack detecting line through corresponding first transistors and second ends connected to corresponding pixels from among the plurality of pixels, and
a plurality of first connecting wires for connecting the plurality of first data lines and pads corresponding to the plurality of first data lines from among the plurality of pads, and the plurality of first connecting wires are provided on one layer from among at least two different layers, wherein:

the plurality of signal lines further include:

a first test voltage line including a first end connected to the first test voltage pad, and a second end connected to second data lines connected to corresponding pixels from among the plurality of pixels through second transistors, wherein:

the first test voltage line includes a resistor with resistance corresponding to a wire resistance of the first crack detecting line, wherein the resistance of the first test voltage line is proportional to the wire resistance and a number of the first data lines, and is inversely proportional to a number of the second data lines.

2. A display device comprising:

a substrate including a display area and a peripheral area provided near the display area;

a plurality of pixels provided in the display area of the substrate;

a plurality of signal lines provided on the substrate and connected to the plurality of pixels; and a pad portion provided in the peripheral area and including a plurality of pads, wherein the plurality of signal lines include:

a first crack detecting line provided in the peripheral area and connected to a first test voltage pad, a plurality of first data lines including first ends connected to the first crack detecting line through corresponding first transistors and second ends connected to corresponding pixels from among the plurality of pixels, and a plurality of first connecting wires for connecting the plurality of first data lines and pads corresponding to the plurality of first data lines from among the plurality of pads, and the plurality of first connecting wires are provided on one layer from among at least two different layers, wherein:

the plurality of signal lines further include:

a first test voltage line including a first end connected to the first test voltage pad, and a second end connected to second data lines connected to corresponding pixels from among the plurality of pixels through second transistors, wherein:

the plurality of signal lines further include:

a second crack detecting line provided in the peripheral area and connected to a second test voltage pad;

a plurality of third data lines including first ends connected to the second crack detecting line through corresponding third transistors, and second ends connected to corresponding pixels from among the plurality of pixels;

a plurality of second connecting wires for connecting the plurality of third data lines and pads corresponding to the plurality of third data lines from among the plurality of pads; and a second test voltage line including a first end connected to the second test voltage pad, and a second end connected to fourth data lines connected to corresponding pixels from among the plurality of pixels through fourth transistors, and the plurality of second connecting wires are provided on one corresponding layer from among the at least two different layers, wherein:

two adjacent second data lines from among the second data lines and two adjacent fourth data lines from among the fourth data lines are alternately arranged, wherein:

the plurality of signal lines further include:

a plurality of third connecting wires for connecting the second data lines and pads corresponding to the second data lines from among the plurality of pads, and a plurality of fourth connecting wires for connecting the fourth data lines and pads corresponding to the fourth data lines from among the plurality of pads, and the plurality of third connecting wires and the plurality of fourth connecting wires are provided on one corresponding layer from among the at least two layers.

3. The display device of claim 2, wherein:

third connecting wires connected to two adjacent second data lines from among the third connecting wires are provided on different layers.

4. A display device comprising:

a substrate including a display area and a peripheral area provided near the display area;

a plurality of pixels provided in the display area of the substrate;

a plurality of signal lines provided on the substrate and connected to the plurality of pixels; and a pad portion provided in the peripheral area and including a plurality of pads, wherein the plurality of signal lines include:

a first crack detecting line provided in the peripheral area and connected to a first test voltage pad, a plurality of first data lines including first ends connected to the first crack detecting line through corresponding first transistors and second ends connected to corresponding pixels from among the plurality of pixels, and a plurality of first connecting wires for connecting the plurality of first data lines and pads corresponding to the plurality of first data lines from among the plurality of pads, and the plurality of first connecting wires are provided on one layer from among at least two different layers, wherein:

the plurality of signal lines further include:

a first test voltage line including a first end connected to the first test voltage pad, and a second end connected to second data lines connected to corresponding pixels from among the plurality of pixels through second transistors, wherein:

the plurality of signal lines further include:

a second crack detecting line provided in the peripheral area and connected to a second test voltage pad;

a plurality of third data lines including first ends connected to the second crack detecting line through corresponding third transistors, and second ends connected to corresponding pixels from among the plurality of pixels;

a plurality of second connecting wires for connecting the plurality of third data lines and pads corresponding to the plurality of third data lines from among the plurality of pads; and a second test voltage line including a first end connected to the second test voltage pad, and a second end connected to fourth data lines connected to corresponding pixels from among the plurality of pixels through fourth transistors, and the plurality of second connecting wires are provided on one corresponding layer from among the at least two different layers, wherein:

a first voltage corresponding to a black gray is configured to be applied to the first test voltage pad and the second test voltage pad in a first detecting mode, and the first voltage is configured to be applied to the first test voltage pad and a voltage corresponding to a white gray is configured to be applied to the second test voltage pad in a second detecting mode.

5. A display device comprising:

a substrate including a display area and a peripheral area provided near the display area;

a plurality of pixels provided in the display area of the substrate;

a plurality of signal lines provided on the substrate and connected to the plurality of pixels; and a pad portion provided in the peripheral area and including a plurality of pads, wherein the plurality of signal lines include:

a first crack detecting line provided in the peripheral area and connected to a first test voltage pad, a plurality of first data lines including first ends connected to the first crack detecting line through corresponding first transistors and second ends connected to corresponding pixels from among the plurality of pixels, and a plurality of first connecting wires for connecting the plurality of first data lines and pads corresponding to the plurality of first data lines from among the plurality of pads, and the plurality of first connecting wires are provided on one layer from among at least two different layers, wherein:

the plurality of signal lines further include:

a first test voltage line including a first end connected to the first test voltage pad, and a second end connected to second data lines connected to corresponding pixels from among the plurality of pixels through second transistors, wherein:

the plurality of signal lines further include:

a second crack detecting line provided in the peripheral area and connected to a second test voltage pad;

a plurality of third data lines including first ends connected to the second crack detecting line through corresponding third transistors, and second ends connected to corresponding pixels from among the plurality of pixels;

a plurality of second connecting wires for connecting the plurality of third data lines and pads corresponding to the plurality of third data lines from among the plurality of pads; and a second test voltage line including a first end connected to the second test voltage pad, and a second end connected to fourth data lines connected to corresponding pixels from among the plurality of pixels through fourth transistors, and the plurality of second connecting wires are provided on one corresponding layer from among the at least two different layers, wherein:

the plurality of signal lines further include a control line connected to gates of the first transistors, gates of the second transistors, gates of the third transistors, and gates of the fourth transistors.

6. The display device of claim 4, wherein:

the first transistors, the second transistors, the third transistors, and the fourth transistors are provided in a region among the pads, the first data lines, the second data lines, the third data lines, and the fourth data lines.

7. The display device of claim 1, wherein:

the first crack detecting line is a wire circulating along an edge of the display area.

8. The display device of claim 1, wherein:

the first crack detecting line is a wire alternately traveling back and forth along one side of the display area.

9. A display device comprising:

a substrate including a display area and a peripheral area provided near the display area;

a plurality of pixels provided in the display area of the substrate; and a plurality of signal lines provided on the substrate and connected to the plurality of pixels, wherein the plurality of signal lines include:

a plurality of data lines connected to the plurality of pixels, a first crack detecting line connected to first data lines from among the plurality of data lines through first transistors, provided in the peripheral area, and configured to receive a black gray voltage, a second crack detecting line connected to second data lines from among the plurality of data lines through second transistors, provided in the peripheral area, and configured to receive a white gray voltage, and a control line connected to gates of the first transistors and gates of the second transistors.

10. The display device of claim 9, further comprising:

a plurality of data pads provided in the peripheral area, connected to the plurality of data lines, and configured to transmit a data voltage applied to the plurality of pixels, wherein the first transistors and the second transistors are provided in a region between the plurality of data pads and the plurality of data lines.

11. The display device of claim 10, wherein:

the plurality of signal lines further include:

a first test voltage line and a second test voltage line connected to third data lines and fourth data lines excluding the first data lines and the second data lines from among the plurality of data lines through third transistors and fourth transistors.

12. The display device of claim 11, wherein:

the first test voltage line includes a resistor with resistance corresponding to wire resistance of the first crack detecting line, and the second test voltage line includes a resistor with resistance corresponding to wire resistance of the second crack detecting line.

13. The display device of claim 10, wherein:

the plurality of signal lines further include a plurality of connecting wires for connecting the plurality of data pads and the plurality of data lines.

14. The display device of claim 13, wherein:

connecting wires connected to adjacent data lines from among the plurality of connecting wires are provided on different layers.

15. The display device of claim 9, wherein:

the first crack detecting line and the second crack detecting line are wires circulating along a corresponding edge of the display area.

* * * * *